United States Patent
Smink et al.

(10) Patent No.: US 10,175,322 B2
(45) Date of Patent: Jan. 8, 2019

(54) ZERO ECHO TIME MR IMAGING WITH SAMPLING OF K-SPACE CENTER

(71) Applicant: KONINKLIJKE PHILIPS N.V., Eindhoven (NL)

(72) Inventors: Jouke Smink, Eindhoven (NL); Paul Royston Harvey, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 190 days.

(21) Appl. No.: 15/112,811

(22) PCT Filed: Jan. 21, 2015

(86) PCT No.: PCT/EP2015/051040
§ 371 (c)(1),
(2) Date: Jul. 20, 2016

(87) PCT Pub. No.: WO2015/113870
PCT Pub. Date: Aug. 6, 2015

(65) Prior Publication Data
US 2016/0341806 A1   Nov. 24, 2016

(30) Foreign Application Priority Data

Jan. 28, 2014   (EP) .................... 14152843

(51) Int. Cl.
*G01R 33/48*   (2006.01)

(52) U.S. Cl.
CPC ..... *G01R 33/4826* (2013.01); *G01R 33/4816* (2013.01)

(58) Field of Classification Search
CPC .................................................. G01R 33/4826
USPC ......................................................... 324/309
See application file for complete search history.

(56) References Cited

U.S. PATENT DOCUMENTS 9,297,871 B2 *   3/2016   Block ................. G06F 17/40
9,829,553 B2 *   11/2017   Grodzki ............. G01R 33/4806

OTHER PUBLICATIONS

Markus Weiger et al:ZTE Imaging in Humans,Magnetic Resonance in Medicine, vol .70, No. 2, Jun. 14, 2013 (Jun. 14, 2013),pp. 328-332.

(Continued)

*Primary Examiner* — Reena Aurora

(57) ABSTRACT

The invention relates to a method of MR imaging of an object positioned in an examination volume of a MR device (1). It is an object of the invention to enable 'silent' ZTE imaging with sampling of k-space center. According to the invention, the object (10) is subjected to an imaging sequence of RF pulses (20) and switched magnetic field gradients (G), wherein an initial RF pulse (20) is radiated before setting a readout magnetic field gradient (G). An initial MR signal is acquired with the readout magnetic field gradient (G) ramping up after a delay after the initial RF pulse (20). Thereafter, the magnetic field gradient (G) remains switched on and the readout direction is gradually varied. Further RF pulses (22) are radiated in the presence of the readout magnetic field gradient (G) and further MR signal are acquired like in conventional ZTE imaging. Finally, a MR image is reconstructed from the acquired MR signals. Moreover, the invention relates to a MR device and to a computer program for a MR device.

20 Claims, 2 Drawing Sheets

(56) References Cited

OTHER PUBLICATIONS

David M. Grodzki et al: "Ultrashort Echo Time Imaging Using Pointwise Encoding Time Reduction with Radial Acquisition (PETRA)", Magnetic'Resonance in Medicine, vol. 67, No. 2, Jun. 30, 2011 (May 30, 2011), pp. 510-518.

Li Cheng et al: "Correction of Excitation Profile in Zero Echo Time (ZTE) Imaging Using Quadratic Phase-Modulated RE Pulse Excitation and Iterative Reconstruction", IEEE Transactions on Medical Imaging, IEEE Service Center, Piscataway, NJ, US, vol. 33, No. 4, Jan. 16, 2014 (Jan. 16, 2014), pp. 961-969.

Markus Weiger et al: "MRI with zero echo time: Hard versus sweep pulse excitation", Magnetic Resonance in Medicine, vol. 66, No. 2, Mar. 4, 2011 (Mar. 4, 2011), pp. 379-389.

Cheng Li et al.: "Zero Echo Time (ZTE) Imaging with Anisotropic Field-of-View" in: "Proceedings of the International Society for Magnetic Resonance in Medicine, 21st Annual Meeting and Exhibition, Salt Lake City, Utah, USA, Apr. 20-26, 2013", Apr. 6, 2013 (Apr. 6, 2013), XP040628359, vol. 21, p. 762.

Ya0tang Wu et al: "Water- and fat-suppressed proton projection MRI (WASPI) of rat femur bone", Magnetic Resonance in Medicine, vol. 57, No. 3, Feb. 26, 2007 (Feb. 26, 2007), pp. 554-567.

Yi Sun et al: "Zero Echo Time Magnetic Resonance Imaging of Contrast-Agent-Enhanced Calcium Phosphate Bone Defect Fillers", Tissue Engineering Part C: Methods, vol. 19, No. 4, Jan. 18, 2013 (Jan. 18, 2013), pp. 281-287.

Jürgen Rahmer et al: "Three-Dimensional Radial Ultrashort Echo-Time Imaging with T2 Adapted Sampling", Magnetic Res0nance in Medicine, vol. 55, Mar. 14, 2006 (Mar. 14, 2006), pp. 1075-1082.

M. Weiger et al: "High-Bandwidth ZTE Imaging with sub-Millisecond TR", Proceedings of the International Society for Magnetic Resonance in Medicine, 21st Annual Meeting and Exhibition, Salt Lake City, Utah, USA, Apr. 20-26, 2013, vol. 21, Apr. 6, 2013 (Apr. 6, 2013), p. 761.

\* cited by examiner

ZERO ECHO TIME MR IMAGING WITH SAMPLING OF K-SPACE CENTER

CROSS REFERENCE TO RELATED APPLICATIONS

This application is a U.S. national phase application of International Application No. PCT/EP2015/051040, filed on Jan. 21, 2015, which claims the benefit of EP Application Serial No. 14152843.0 filed on Jan. 28, 2014 and is incorporated herein by reference.

FIELD OF THE INVENTION

The invention relates to the field of magnetic resonance (MR) imaging. It concerns a method of MR imaging. The invention also relates to a MR device and to a computer program to be run on a MR device.

BACKGROUND OF THE INVENTION

Image-forming MR methods which utilize the interaction between magnetic fields and nuclear spins in order to form two-dimensional or three-dimensional images are widely used nowadays, notably in the field of medical diagnostics, because for the imaging of soft tissue they are superior to other imaging methods in many respects, do not require ionizing radiation and are usually not invasive.

According to the MR method in general, the body of the patient to be examined is arranged in a strong, uniform magnetic field ($B_0$ field) whose direction at the same time defines an axis (normally the z-axis) of the co-ordinate system on which the measurement is based. The magnetic field produces different energy levels for the individual nuclear spins in dependence on the magnetic field strength which can be excited (spin resonance) by application of an electromagnetic alternating field (RF field, also referred to as $B_1$ field) of defined frequency (so-called Larmor frequency, or MR frequency). From a macroscopic point of view the distribution of the individual nuclear spins produces an overall magnetization which can be deflected out of the state of equilibrium by application of an electromagnetic pulse of appropriate frequency (RF pulse), so that the magnetization performs a precessional motion about the z-axis. The precessional motion describes a surface of a cone whose angle of aperture is referred to as flip angle. The magnitude of the flip angle is dependent on the strength and the duration of the applied electromagnetic pulse. In the case of a so-called 90° pulse, the spins are deflected from the z axis to the transverse plane (flip angle 90°).

After termination of the RF pulse, the magnetization relaxes back to the original state of equilibrium, in which the magnetization in the z direction is built up again with a first time constant $T_1$ (spin lattice or longitudinal relaxation time), and the magnetization in the direction perpendicular to the z direction relaxes with a second time constant $T_2$ (spin-spin or transverse relaxation time). The variation of the magnetization can be detected by means of one or more receiving RF coils which are arranged and oriented within an examination volume of the MR device in such a manner that the variation of the magnetization is measured in the direction perpendicular to the z-axis. The decay of the transverse magnetization is accompanied, after application of, for example, a 90° pulse, by a transition of the nuclear spins (induced by local magnetic field inhomogeneity) from an ordered state with the same phase to a state in which all phase angles are uniformly distributed (dephasing). The dephasing can be compensated by means of a refocusing pulse (for example a 180° pulse). This produces an echo signal (spin echo) in the receiving coils.

In order to realize spatial resolution in the body, linear magnetic field gradients extending along the three main axes are superposed on the uniform magnetic field, leading to a linear spatial dependency of the spin resonance frequency. The signal picked up in the receiving coils then contains components of different frequencies which can be associated with different locations in the body. The MR signal data obtained via the RF coils corresponds to the spatial frequency domain and is called k-space data. The k-space data usually includes multiple lines acquired with different phase encoding. Each line is digitized by collecting a number of samples. A set of k-space data is converted to a MR image by means of Fourier transformation or other appropriate reconstruction algorithms.

MR imaging of tissues with very short transverse relaxation times, such as bone or lung, is becoming increasingly important. Nearly all known methods for this purpose basically employ three-dimensional (3D) radial k-space sampling. In the so-called zero echo time (ZTE) technique a readout gradient is set before excitation of magnetic resonance with a high-bandwidth and thus short, hard RF pulse. In this way, gradient encoding starts instantaneously upon excitation of magnetic resonance. The acquisition of a free induction decay (FID) signal starts immediately after radiation of the RF pulse resulting in an effectively zero 'echo time' (TE). After the FID readout, only minimal time is required for setting of the next readout gradient before the next RF pulse can be applied, thus enabling very short repetition times (TR). The readout direction is incrementally varied from repetition to repetition until a spherical volume in k-space is sampled to the required extent. Without the need for switching off the readout gradient between TR intervals, ZTE imaging can be performed virtually silently (see Weiger et al, Magnetic Resonance in Medicine, vol. 70, p. 328-332, 2013).

A challenge in ZTE imaging is that the k-space data are slightly incomplete in the k-space center due to the initial dead time that is caused by the finite duration of the RF pulse, transmit-receive switching, and signal filtering.

This k-space gap can be addressed, for example, by combining the radial ZTE sampling with extra Cartesian sampling of the k-space center, like in the known PETRA technique (see Grodzki et al, Magnetic Resonance in Medicine, vol. 67, p. 510-518, 2012). However, a drawback of the PETRA approach is that the imaging is no longer silent due to the necessary gradient switching for the Cartesian acquisition of the k-space center.

SUMMARY OF THE INVENTION

From the foregoing it is readily appreciated that there is a need for an improved method of ZTE imaging. It is an object of the invention to enable 'silent' ZTE imaging with sampling of k-space center.

In accordance with the invention, a method of MR imaging of an object positioned in the examination volume of a MR device is disclosed. The method of the invention comprises the steps of:
subjecting the object to an imaging sequence of RF pulses and switched magnetic field gradients, which imaging sequence comprises the following successive steps:
i) radiating an initial RF pulse;
ii) setting a readout magnetic field gradient having a readout direction and a readout strength;

iii) acquiring an initial MR signal in the presence of the readout magnetic field gradient, wherein the MR signal represents a radial k-space sample;

iv) gradually varying the readout direction while keeping the readout strength constant;

v) radiating a further RF pulse in the presence of the readout magnetic field gradient;

vi) acquiring a further MR signal in the presence of the readout magnetic field gradient, wherein the further MR signal represents a radial k-space sample;

vii) sampling at least a part of a spherical k-space volume by repeating steps iv) through vi) a number of times; reconstructing a MR image from the acquired MR signals.

According to the invention, the radial ZTE acquisition is principally applied in the conventional fashion. MR signals are acquired as radial k-space samples by repeating the radiation of RF pulses while the readout direction is gradually varied until a desired volume in k-space is sampled and a MR image can be reconstructed from the acquired MR signals.

However, the invention proposes that the first RF pulse— herein referred to as 'initial RF pulse' for distinguishing it from the 'further RF pulses' radiated as in conventional ZTE imaging—is radiated with the magnetic field gradient being switched off. The magnetic field gradient is switched on to the initially set readout direction and readout strength with a delay after radiation of the initial RF pulse. This delay should be longer than the dead time so as to enable the acquisition of the initial MR signal while ramping up the magnetic field gradient from zero to the given readout strength. In this way, it is achieved that the initial MR signal comprises data from k=0, i.e. the k-space center.

The MR image is finally reconstructed from a signal dataset comprising both the 'initial' and 'further' MR signals acquired according to the invention.

By acquiring data from the k-space center, the invention effectively avoids noise amplification and partial deterioration of the spatial response function caused by the gap of the acquired data around k=0 in conventional ZTE imaging.

The acquisition of the initial MR signal while the magnetic field gradient is ramping up from zero corresponds to the known ultra short echo time (UTE) technique (see, for example, Rahmer et al, Magnetic Resonance in Medicine, vol. 55, p. 1075-1082, 2006). Thus, the invention can be said to combine UTE and ZTE imaging. According to the invention, the magnetic field gradient is switched off when radiating the initial RF pulse (like in UTE imaging). Then the magnetic field gradient is switched on and remains switched on while radiating the further RF pulses (like in ZTE imaging).

Although the imaging sequence of the invention is not entirely silent due to the switching of the magnetic field gradient after radiation of the initial RF pulse, it definitely produces significantly less gradient switching noise than other techniques like, for example, the above-mentioned PETRA technique.

An additional RF pulse may be applied with the magnetic gradient field switched off and (an) associated additional MR signal(s) acquired from the dead-time for transmit-receive switching form the additional RF pulse and still with the magnetic gradient field switched off. This achieves to sample k-space away from the centre of k-space (k=0) along the radial direction corresponding to zero magnetic field gradient. This addition MR signals add to a more complete sampling of k-space near the centre of k-space. The MR image is finally reconstructed from a signal dataset comprising both the 'initial' and 'further' MR signals as well as the 'additional' MR signals.

In a preferred embodiment of the invention, the magnetic field gradient is switched off after sampling a part of the spherical k-space volume, wherein a further part of the spherical k-space volume is sampled by repeating steps i) through vii) after a delay period. This means, in other words, that a number of repetitions (or 'shots') of the imaging sequence of the invention is applied in order to fully sample the required k-space volume. This multi-shot approach has the advantage that the correspondingly segmented acquisition of k-space enables the generation of contrast in the reconstructed MR image in a targeted fashion. In this variant, the imaging sequence of the invention may constitute a 'turbo' sequence (like in conventional so-called turbo field echo 'TFE' imaging), with the 'turbo factor' designating the number of signal acquisitions after each initial excitation RF pulse. Hence, the method of the invention may also be referred to as 'turbo ZTE imaging'.

In order to generate a desired contrast, at least one magnetization preparation pre-pulse may be radiated before radiating the initial RF pulse, i.e. before each repetition (or each 'shot') of the sequence. The preparation pre-pulse may, for example, be a (fat) saturation pre-pulse, a magnetization inversion pre-pulse (to generate $T_1$ contrast), a $T_2$ preparation pre-pulse, a preparation sequence for generating diffusion weighting, or other contrast generating preparation pre-pulses or preparation sequences well known per se in the art.

In a preferred embodiment of the invention, the acquired initial and/or the further MR signals are FID signals, like in conventional ZTE or UTE imaging. In this way, the method enables imaging of tissue having a very short transverse relaxation time $T_2$.

The method of the invention described thus far can be carried out by means of a MR device including at least one main magnet coil for generating a uniform steady magnetic field within an examination volume, a number of gradient coils for generating switched magnetic field gradients in different spatial directions within the examination volume, at least one RF coil for generating RF pulses within the examination volume and/or for receiving MR signals from a body of a patient positioned in the examination volume, a control unit for controlling the temporal succession of RF pulses and switched magnetic field gradients, and a reconstruction unit. The method of the invention is preferably implemented by a corresponding programming of the reconstruction unit and/or the control unit of the MR device.

The method of the invention can be advantageously carried out in most MR devices in clinical use at present. To this end it is merely necessary to utilize a computer program by which the MR device is controlled such that it performs the above-explained method steps of the invention. The computer program may be present either on a data carrier or be present in a data network so as to be downloaded for installation in the control unit of the MR device.

BRIEF DESCRIPTION OF THE DRAWINGS

The enclosed drawings disclose preferred embodiments of the present invention. It should be understood, however, that the drawings are designed for the purpose of illustration only and not as a definition of the limits of the invention. In the drawings.

DETAILED DESCRIPTION OF THE EMBODIMENTS

Figure 1:
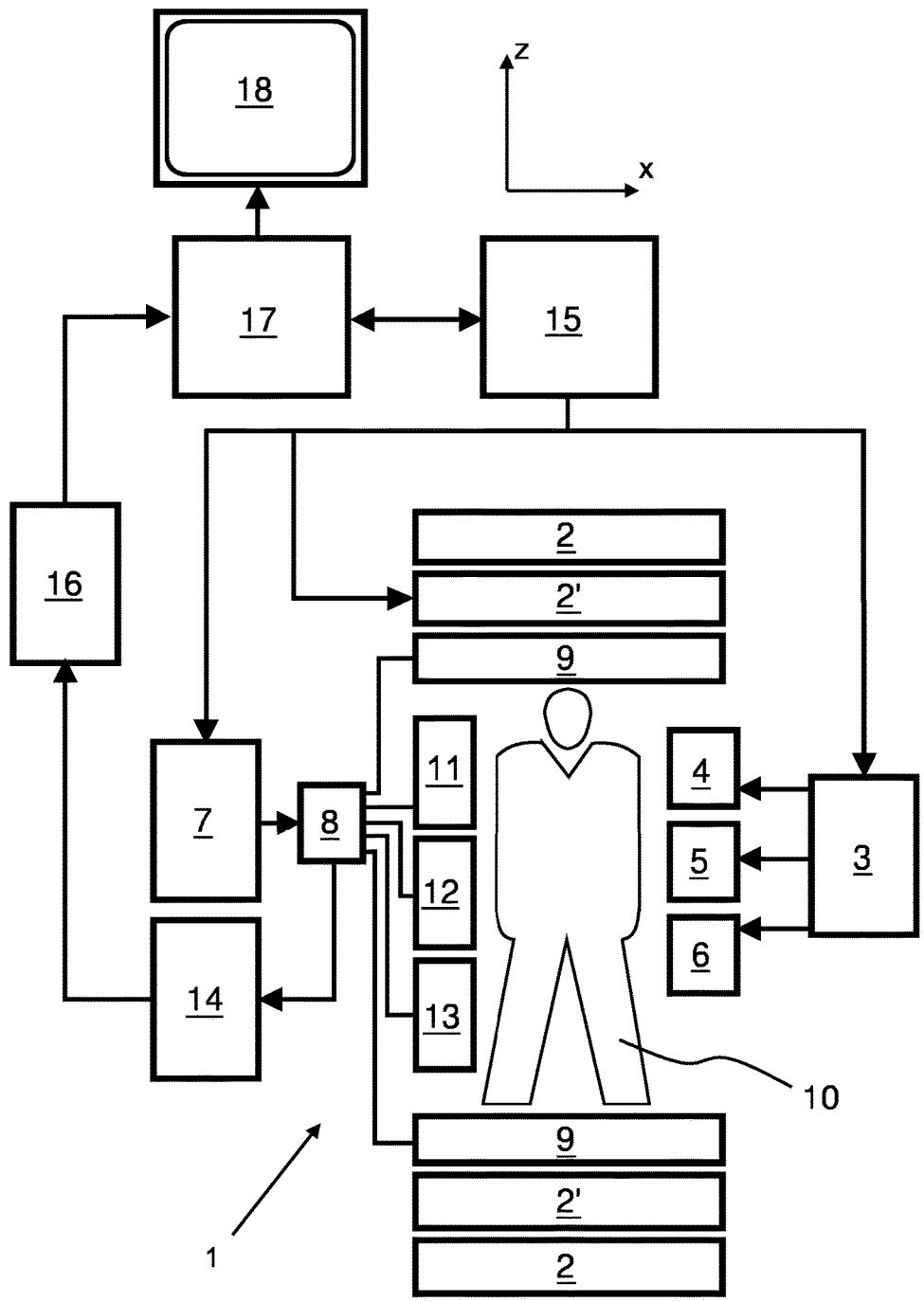
FIG. 1 schematically shows a MR device for carrying out the method of the invention.

With reference to FIG. 1, a MR device 1 which can be used for carrying out the method of the invention is shown. The device comprises superconducting or resistive main magnet coils 2 such that a substantially uniform, temporally constant main magnetic field $B_0$ is created along a z-axis through an examination volume. The device further comprises a set of ($1^{st}$, $2^{nd}$, and—where applicable—$3^{rd}$ order) shimming coils 2', wherein the current flow through the individual shimming coils of the set 2' is controllable for the purpose of minimizing $B_0$ deviations within the examination volume.

A magnetic resonance generation and manipulation system applies a series of RF pulses and switched magnetic field gradients to invert or excite nuclear magnetic spins, induce magnetic resonance, refocus magnetic resonance, manipulate magnetic resonance, spatially and otherwise encode the magnetic resonance, saturate spins, and the like to perform MR imaging.

More specifically, a gradient pulse amplifier 3 applies current pulses to selected ones of whole-body gradient coils 4, 5 and 6 along x, y and z-axes of the examination volume. A digital RF frequency transmitter 7 transmits RF pulses or pulse packets, via a send-/receive switch 8, to a-body RF coil 9 to transmit RF pulses into the examination volume. A typical MR imaging sequence is composed of a packet of RF pulse segments of short duration which taken together with each other and any applied magnetic field gradients achieve a selected manipulation of nuclear magnetic resonance. The RF pulses are used to saturate, excite resonance, invert magnetization, refocus resonance, or manipulate resonance and select a portion of a body 10 positioned in the examination volume. The MR signals are also picked up by the body RF coil 9.

For generation of MR images of limited regions of the body 10 by means of parallel imaging, a set of local array RF coils 11, 12, 13 are placed contiguous to the region selected for imaging. The array coils 11, 12, 13 can be used to receive MR signals induced by body-coil RF transmissions.

The resultant MR signals are picked up by the body RF coil 9 and/or by the array RF coils 11, 12, 13 and demodulated by a receiver 14 preferably including a preamplifier (not shown). The receiver 14 is connected to the RF coils 9, 11, 12 and 13 via send-/receive switch 8.

A host computer 15 controls the current flow through the shimming coils 2' as well as the gradient pulse amplifier 3 and the transmitter 7 to generate a ZTE imaging sequence according to the invention. The receiver 14 receives a plurality of MR data lines in rapid succession following each RF excitation pulse. A data acquisition system 16 performs analog-to-digital conversion of the received signals and converts each MR data line to a digital format suitable for further processing. In modern MR devices the data acquisition system 16 is a separate computer which is specialized in acquisition of raw image data.

Ultimately, the digital raw image data is reconstructed into an image representation by a reconstruction processor 17 which applies an appropriate reconstruction algorithm. The MR image represents a three-dimensional volume. The image is then stored in an image memory where it may be accessed for converting projections or other portions of the image representation into appropriate format for visualization, for example via a video monitor 18 which provides a human-readable display of the resultant MR image.

Figure 2:
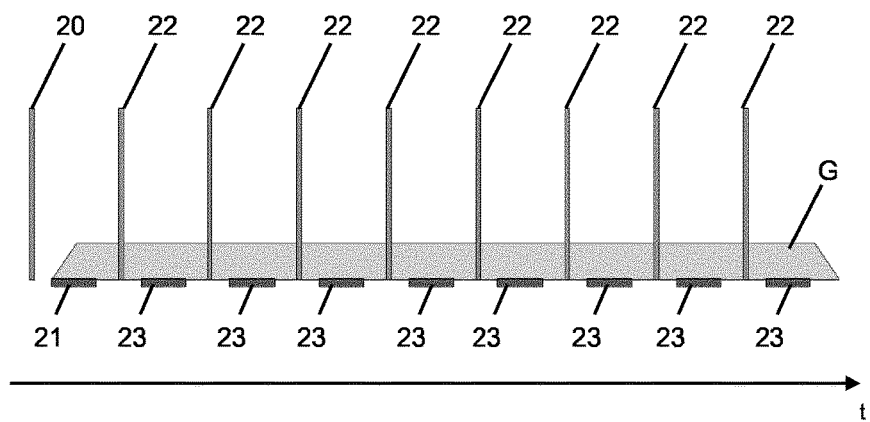
FIG. 2 shows a diagram illustrating the ZTE sequence applied according to the invention.

FIG. 2 shows a diagram illustrating the modified ZTE sequence applied according to the invention. The sequence starts with the radiation of an initial RF pulse 20 with the readout magnetic field gradient G being switched off. Readout of an initial MR signal takes place during interval 21.

As mentioned before, a known constraint of conventional ZTE imaging is that there is a finite time between the center of each RF pulse and the start of the respective sampling interval. Depending on the equipment used, this 'dead time' may be anything between 2 μs and 200 μs. As a consequence, the center of k-space cannot be scanned.

In the embodiment of the invention depicted in FIG. 2 the temporal delay between the radiation of the initial RF pulse 20 and the beginning of the acquisition interval 21 is longer than the dead time. Simultaneously, the frequency-encoding magnetic field gradient G starts ramping up at the beginning of acquisition interval 21 from zero to a given readout strength. In this way, sampling of k-space center is achieved according to the invention. By acquiring data from the k-space center, the invention effectively avoids noise amplification and partial deterioration of the spatial response function caused by the gap of the acquired data around k=0 in conventional ZTE imaging.

The essence of the 'silent' ZTE technique adopted by the invention is that further excitation RF pulses 22 are transmitted simultaneously with the frequency-encoding readout magnetic field gradients G being switched on. The readout magnetic field gradient G is not intended as a slice-selection gradient which implies that the RF pulses 20 have to be short (typically 1 μs to 8 μs) in order to achieve sufficient excitation bandwidth. The readout of further MR signals takes place during intervals 23 in the presence of the readout magnetic field gradient G. Each interval 21 has a duration between 100 μs and 3 ms. The readout magnetic field gradient G has a readout strength and a readout direction both staying substantially constant over each excitation/readout cycle (except the initial cycle consisting of the initial RF pulse 20 and initial readout 21). After each cycle, the readout direction is varied only very gradually (not depicted in FIG. 2). The readout direction changes only slightly, e.g. by a few degrees (e.g. 2°). For a full sampling of k-space, the readout direction is varied until a spherical volume is covered with sufficient density.

As illustrated in FIG. 2, the essential feature of the method of the invention is that the magnetic field gradient G is switched off when radiating the initial RF pulse 20 (like in UTE imaging). Then the magnetic field gradient G is switched on and remains switched on while radiating the further RF pulses 22 (like in ZTE imaging).

As further illustrated in FIG. 2, the magnetic field gradient G is switched off after sampling a portion of k-space by number of excitation/readout cycles. A further portion of k-space is sampled by a corresponding further 'shot' of the imaging sequence after a delay period. A number of shots of the imaging sequence of the invention are applied in order to fully sample the required k-space volume. A MR image is finally reconstructed from the MR signals acquired during intervals 21 and 23 of all shots of the sequence.

Figure 3:
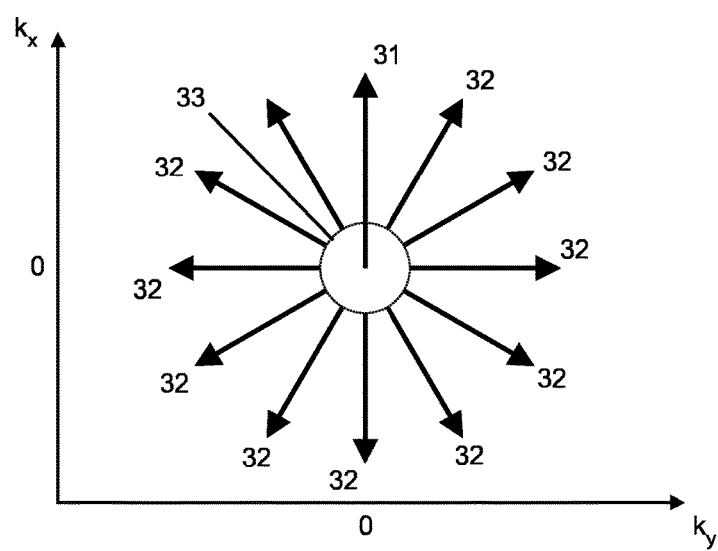
FIG. 3 shows a diagram illustrating the radial sampling of k-space according to an embodiment of the invention.

FIG. 3 shows the k-space sampling scheme of the invention. The diagram shows only the $k_x$ and $k_y$ directions for the purpose of illustration. It has to be noted, however, that a three-dimensional radial sampling of a spherical volume in k-space is performed by the method of the invention. A number of radial k-space lines are shown. k-space line 31 is acquired as an initial MR signal after the initial RF pulse (RF pulse 20 in FIG. 2), while k-space lines 32 are acquired as further MR signals after each further RF pulse (RF pulses 22 in FIG. 2). As can be seen in FIG. 3, the initial k-space line 31 samples the k-space center ($k_x=k_y=0$), while the further k-space lines 32 start with a certain distance from the k-space center. The size of the central spherical gap 33 is determined by the dead time and the correspondingly selected delay between the RF pulses and the beginning of the respective sampling intervals.

The invention claimed is:

1. A method of magnetic resonance (MR) imaging of an object positioned in an examination volume of a MR device, the method comprising:
   subjecting the object to an imaging sequence of RF pulses and switched magnetic field gradients, which imaging sequence comprises the following successive steps:
   i) radiating an initial RF pulse 20);
   ii) after a delay after the initial RF pulse longer than the dead-time of switching between RF transmit and receive, applying a readout magnetic field gradient having a set readout direction and a readout strength;
   iii) acquiring an initial MR signal in the presence of the readout magnetic field gradient, wherein the MR signal represents a radial k-space sample;
   iv) iv) gradually varying the readout direction while keeping the readout strength constant;
   v) v) radiating a further RF pulse in the presence of the readout magnetic field gradient;
   vi) vi) acquiring a further MR signal in the presence of the readout magnetic field gradient after a delay equal to the dead-time after the further RF pulse, the further RF pulse having a pulse duration much shorter than the time between subsequent further RF pulses, wherein the further MR signal represents a radial k-space sample;
   vii) sampling at least a part of a spherical k-space volume by repeating steps iv) through vi) a number of times; and
   reconstructing a MR image from the acquired MR signals.

2. The method of claim 1, wherein the initial MR signal is acquired while ramping up the magnetic field gradient from zero to the given readout strength.

3. The method of claim 1, wherein an additional RF pulse is radiated and an additional MR signal is acquired with a delay of the dead-time after the additional RF pulse with the magnetic field gradient being switched off.

4. The method of claim 1, wherein the magnetic field gradient is switched off after sampling a part of the spherical k-space volume, wherein a further part of the spherical k-space volume is sampled by repeating steps i) through vii) after a delay period.

5. The method of claim 1, wherein at least one magnetization preparation pre-pulse is radiated before radiating the initial RF pulse.

6. The Method of claim 1, wherein at least one of the initial RF pulse and the further MR are free induction decay (FID) signals.

7. A magnetic resonance (MR) device comprising at least one main magnet coil for generating a uniform, steady magnetic field within an examination volume, a number of gradient coils for generating switched magnetic field gradients in different spatial directions within the examination volume, at least one RF coil for generating RF pulses within the examination volume and/or for receiving MR signals from an object positioned in the examination volume, a control unit for controlling the temporal succession of RF pulses and switched magnetic field gradients, and a reconstruction unit, wherein the MR device is arranged to perform the following steps:
   subjecting the object to an imaging sequence of RF pulses and switched magnetic field gradients, which imaging sequence comprises the following successive steps:
   i) radiating an initial RF pulse;
   ii) ii) after a delay after the initial RF pulse longer than the dead-time of switching between RF transmit and receive, applying a readout magnetic field gradient having a set readout direction and a readout strength; subsequently applying a readout magnetic field gradient having a readout direction and a readout strength and with a delay after the initial RF pulse longer than the dead-time of switching between RF transmit and receive;
   iii) acquiring an initial MR signal in the presence of the readout magnetic field gradient, wherein the MR signal represents a radial k-space sample;
   iv) gradually varying the readout direction while keeping the readout strength constant;
   v) radiating a further RF pulse in the presence of the readout magnetic field gradient;
   vi) acquiring a further MR signal in the presence of the readout magnetic field gradient after a delay equal to the dead-time after the further RF pulse, the further RF pulse having a pulse duration much shorter than the time between subsequent further RF pulses, wherein the further MR signal represents a radial k-space sample;
   vii) sampling at least a part of a spherical k-space volume by repeating steps iv) through vi) a number of times; and
   reconstructing a MR image from the acquired MR signals.

8. The MR device of claim 7, wherein the initial MR signal is acquired while ramping up the magnetic field gradient from zero to the given readout strength.

9. The MR device of claim 7, wherein an additional RF pulse is radiated and an additional MR signal is acquired with a delay of the dead-time after the additional RF pulse with the magnetic field gradient being switched off.

10. The MR of claim 7, wherein the magnetic field gradient is switched off after sampling a part of the spherical k-space volume, wherein a further part of the spherical k-space volume is sampled by repeating steps i) through vii) after a delay period.

11. The MR device of claim 7, wherein at least one magnetization preparation pre-pulse is radiated before radiating the initial RF pulse.

12. The MR device of claim 7, wherein at least one of the initial RF pulse and the further MR are free induction decay (FID) signals.

13. The MR device of claim 7, wherein the initial MR signal is acquired while ramping up the magnetic field gradient from zero to the given readout strength.

14. A non-transitory computer-readable medium embodied with a computer program including instructions executable on a magnetic resonance (MR) device, the computer program comprising:
   generating an imaging sequence of RF pulses and switched magnetic field gradients, which imaging sequence comprises the following successive steps:
   i) radiating an initial RF pulse;
   ii) after a delay after the initial RF pulse longer than the dead-time of switching between RF transmit and receive, applying a readout magnetic field gradient having a set readout direction and a readout strength;

iii) acquiring an initial MR signal in the presence of the readout magnetic field gradient, wherein the MR signal represents a radial k-space sample;

iv) gradually varying the readout direction while keeping the readout strength constant;

v) radiating a further RF pulse in the presence of the readout magnetic field gradient;

vi) acquiring a further MR signal in the presence of the readout magnetic field gradient after a delay equal to the dead-time after the further RF pulse, the further RF pulse having a pulse duration much shorter than the time between subsequent further RF pulses, wherein the further MR signal represents a radial k-space sample;

vii) sampling at least a part of a spherical k-space volume by repeating steps iv) through vi) a number of times; and reconstructing a MR image from the acquired MR signals.

15. The non-transitory computer-readable-medium embodied with the computer program of claim 14, wherein the, wherein the initial MR signal is acquired while ramping up the magnetic field gradient from zero to the given readout strength.

16. The non-transitory computer-readable-medium embodied with the computer program of claim 14, wherein the computer program is configured to radiate an additional RF pulse and acquire an additional MR signal with a delay of the dead-time after the additional RF pulse with the magnetic field gradient being switched off.

17. The non-transitory computer-readable-medium embodied with the computer program of claim 14, wherein the computer program is configured to switch off the magnetic field gradient after sampling a part of the spherical k-space volume, wherein a further part of the spherical k-space volume is sampled by repeating steps i) through vii) after a delay period.

18. The non-transitory computer-readable-medium embodied with the computer program of claim 14, wherein the computer program is configured to radiate at least one magnetization preparation pre-pulse before radiating the initial RF pulse.

19. The non-transitory computer-readable-medium embodied with the computer program of claim 14, wherein at least one of the initial RF pulse and the further MR are free induction decay (FID) signals.

20. The non-transitory computer-readable-medium embodied with the computer program of claim 14, wherein computer program is configured to acquire the initial MR signal while ramping up the magnetic field gradient from zero to the given readout strength.

* * * * *